United States Patent
Czaplewski et al.

(10) Patent No.: US 10,324,314 B2
(45) Date of Patent: Jun. 18, 2019

(54) ULTRA-FLAT OPTICAL DEVICE WITH HIGH TRANSMISSION EFFICIENCY

(71) Applicant: UCHICAGO ARGONNE, LLC, Chicago, IL (US)

(72) Inventors: David A. Czaplewski, Naperville, IL (US); Daniel Lopez, Chicago, IL (US); Tapashree Roy, Lemont, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 15/604,490

(22) Filed: May 24, 2017

(65) Prior Publication Data

US 2018/0341124 A1 Nov. 29, 2018

(51) Int. Cl.
*G02B 1/00* (2006.01)
*G02B 5/20* (2006.01)
(Continued)

(52) U.S. Cl.
CPC ........... *G02F 1/0102* (2013.01); *G02B 1/002* (2013.01); *G02F 1/0063* (2013.01);
(Continued)

(58) Field of Classification Search
CPC . G02F 1/00; G02F 1/0009; G02F 1/01; G02F 1/0102; G02F 1/0121; G02F 1/017;
(Continued)

(56) References Cited

U.S. PATENT DOCUMENTS

| | | | | |
|---|---|---|---|---|
| 3,348,093 A | * | 10/1967 | Sandor | G02F 1/00 250/493.1 |
| 4,028,652 A | * | 6/1977 | Wakino | H01P 1/207 331/107 DP |

(Continued)

OTHER PUBLICATIONS

Arbabi, et al., "Multiwavelength metasurfaces through spatial multiplexing," Scientific Reports 6, 32803, 8 pages (2016).
(Continued)

*Primary Examiner* — Loha Ben
(74) *Attorney, Agent, or Firm* — Foley & Lardner LLP

(57) ABSTRACT

An optical device includes a nanostructured transparent dielectric film, which is a Huygens metasurface. The Huygens metasurface imparts a phase change to light propagating through or reflecting from the surface. The phase change can be achieved by means of a resonant interaction between light and the Huygens resonators, resulting in a controllable phase change of 0 to $2\pi$ with approximately 100% light transmission characterized by a below 0.1 dielectric loss tangent of delta and with the height of the resonators less than the wavelength of light. In one embodiment, the metasurface includes titanium dioxide, but many materials or stacks of different materials may be used. The optical device is functional throughout the visible spectrum between 380 and 700 nm. The nanostructured transparent dielectric film includes a plurality of Huygens resonators. The phase and the amplitude of the nanostructured transparent dielectric film are modulated by arranging the plurality of Huygens resonators such that certain properties, including the
(Continued)

radius and height of each Huygens resonator, as well as the gap between two adjacent Huygens resonators, are controlled to optimize the performance of the optical device within the visible spectrum.

14 Claims, 10 Drawing Sheets

(51) Int. Cl.
G02F 1/00 (2006.01)
G02F 1/01 (2006.01)
G02F 1/23 (2006.01)
H01P 7/00 (2006.01)
H01P 7/10 (2006.01)
H01S 3/00 (2006.01)
H01S 3/08 (2006.01)
H01S 5/10 (2006.01)
B82Y 20/00 (2011.01)

(52) U.S. Cl.
CPC .......... G02F 1/0072 (2013.01); G02F 1/0081 (2013.01); G02F 1/01 (2013.01); H01P 7/10 (2013.01); H01S 3/08 (2013.01); H01S 5/10 (2013.01); B82Y 20/00 (2013.01); G02B 5/201 (2013.01); G02F 1/0121 (2013.01); G02F 1/23 (2013.01); G02F 2202/30 (2013.01); G02F 2202/42 (2013.01); H01P 7/00 (2013.01); H01S 3/00 (2013.01)

(58) Field of Classification Search
CPC . G02F 1/23; G02F 1/35; G02F 1/0063; G02F 1/0072; G02F 1/0081; G02F 2202/30; G02F 2202/42; G01J 3/12; G01J 2003/1252; H01P 7/00; H01P 7/10; H01S 1/00; H01S 3/00; H01S 3/08; H01S 3/082; H01S 3/13; H01S 5/10; H01S 5/1042; H01S 5/12; H01Q 15/006; H01Q 15/0086; G04G 9/0005; G04G 9/0041; G02B 1/002; G02B 1/005; G02B 5/1866; G02B 5/1871; G02B 5/20; G02B 5/201; G02B 5/281; G02B 5/284; G02B 5/3025; G02B 26/00; G02B 1/007; G02B 1/02; G02B 13/14; B82Y 20/00
USPC ............... 359/240, 276, 278, 279, 290, 291; 333/219, 219.1, 227, 235; 372/9, 20, 21, 372/29.01, 29.014, 29.016, 29.023, 31, 372/32, 66, 92, 96–99, 103, 108
See application file for complete search history.

(56) References Cited

U.S. PATENT DOCUMENTS

| | | | | |
|---|---|---|---|---|
| 4,459,570 A | * | 7/1984 | Delaballe | H01P 7/10 333/202 |
| 4,506,241 A | * | 3/1985 | Makimoto | H01P 1/202 29/600 |
| 4,862,122 A | * | 8/1989 | Blair, Jr. | H01P 1/20 333/202 |
| 5,436,754 A | * | 7/1995 | Ishihara | B82Y 20/00 359/240 |
| 6,104,261 A | * | 8/2000 | Sonoda | H01P 7/10 333/202 |
| 6,882,739 B2 | | 4/2005 | Kurtz et al. | |
| 9,374,887 B1 | * | 6/2016 | Warne | H05K 1/024 |
| 9,507,064 B2 | * | 11/2016 | Brongersma | G02B 1/002 |
| 9,577,477 B2 | * | 2/2017 | Fujiyama | H01P 7/10 |
| 9,685,765 B2 | * | 6/2017 | Sinclair | H01S 5/12 |
| 9,739,918 B2 | * | 8/2017 | Arbabi | G02B 5/3025 |
| 9,911,902 B2 | * | 3/2018 | Sawamura | H01L 33/0008 |
| 10,054,839 B1 | * | 8/2018 | Brener | G02F 1/353 |
| 10,128,387 B1 | * | 11/2018 | Liu | H01L 31/02327 |
| 2016/0025914 A1 | | 1/2016 | Brongersma et al. | |
| 2016/0077261 A1 | | 3/2016 | Arbabi et al. | |
| 2016/0156090 A1 | | 6/2016 | Campione et al. | |
| 2017/0212285 A1 | * | 7/2017 | Arbabi | G02B 5/1847 |
| 2018/0341090 A1 | * | 11/2018 | Devlin | H01L 31/02 |

OTHER PUBLICATIONS

Avayu, et al., "Composite functional metasurfaces for multispectral achromatic optics," Nature Communications 8, 14992, 7 pages (2017).
Chen & Craighead, "Diffractive lens fabricated with mostly zeroth-order gratings," Optics Letters 21(3), pp. 177-179 (1996).
Chen & Craighead, "Diffractive phase elements based on two-dimensional artificial dielectrics," Optics Letters 20(2), pp. 121-123 (1995).
Chen, et al., "A broadband achromatic metalens for focusing and imaging in the visible," Nature Nanotechnology 13, pp. 220-226 (2018).
Decker & Staude, et al., "Resonant dielectric nanostructures: a low-loss platform for functional nanophotonics," Journal of Optics 18(10) (2016).
Devlin, et al., "Broadband high-efficiency dielectric metasurfaces for the visible spectrum," Proceedings of the National Academy of Sciences USA, 201611740, 6 pages (2016).
Estakhri & Alu, "Recent progress in gradient metasurfaces," Journal of the Optical Society of America B 33(2), pp. A21-A30 (2016).
Evlyukhin, et al., "Optical response features of Si-nanoparticle arrays," Physical Review B 82, 045404, 12 pages (2010).
Faklis & Morris, et al., "Spectral properties of multiorder diffractive lenses," Applied Optics 34(14), pp. 2462-2468 (1995).
Fu, et al., "Directional visible light scattering by silicon nanoparticles," Nature Communications 4, 1527, 6 pages (2013).
Genevet, et al., "Recent advances in planar optics: from plasmonic to dielectric metasurfaces," Optica 4(1), pp. 139-152 (2017).
Hu, et al., "Plasmonic Lattice Lenses for Multiwavelength Achromatic Focusing," ACS Nano 10(11), pp. 10275-10282 (2016).
Jahani & Jacob, "All-dielectric metamaterials," Nature Nanotechnology 11, pp. 23-36 (2016).
Khorasaninejad & Capasso, "Metalenses: Versatile multifunctional photonic components," Science 358(6367), 1146, 8 pages (2017).
Khorasaninejad, et al., "Achromatic Metalens over 60 nm Bandwidth in the Visible and Metalens with Reverse Chromatic Dispersion," Nano Letters 17(3), pp. 1819-1824 (2017).
Khorasaninejad, et al., "Polarization-Insensitive Metalenses at Visible Wavelengths," Nano Letters 16(11), pp. 7229-7234 (2016).
Kuznetsov, et al., "Optically resonant dielectric nanostructures," Science 354(6314), aag2472, 10 pages (2016).
Li, et al., "Achromatic flat optical components via compensation between structure and material dispersions," Scientific Reports 6, 19885, 7 pages (2016).
Liddle & Gallatin, "Nanomanufacturing: A Perspective," ACS Nano 10(3), pp. 2995-3014 (2016).
Moreno, et al., "High efficiency diffractive lenses: Deduction of kinoform profile" American Journal of Physics 65, pp. 556-562 (1997).
Nagar, et al., "Apochromatic singlets enabled by metasurface-augmented GRIN lenses," Optica 5(2), pp. 99-102 (2018).
Piyawattanametha, et al., "In vivo near-infrared dual-axis confocal microendoscopy in the human lower gastrointestinal tract," Journal of Biomedical Optics 17(2), 021102, 5 pages (2012).
Roy, et al., "Dynamic metasurface lens based on MEMS technology," APL Photonics 3, 021302, 8 pages (2018).
Shi, et al., "Single-Layer Metasurface with Controllable Multiwavelength Functions," Nano Letters 18(4), pp. 2420-2427 (2018).
Staude & Schilling, "Metamaterial-inspired silicon nanophotonics," Nature Photonics 11, pp. 274-284 (2017).
Staude, et al., "Tailoring Directional Scattering through Magnetic and Electric Resonances in Subwavelength Silicon Nanodisks," ACS Nano 7(9), pp. 7824-7832 (2013).

(56) References Cited

OTHER PUBLICATIONS

Taghizadeh, et al., "Design and fabrication of diffractive elements for laser material processing applications," Optics and Lasers in Engineering 34(4-6), pp. 289-307 (2000).
Van De Groep & Polman, "Designing dielectric resonators on substrates: Combining magnetic and electric resonances," Optics Express 21(22), pp. 26285-26302 (2013).
Wang, et al., "A broadband achromatic metalens in the visible," Nature Nanotechnology 13, pp. 227-232 (2018).
Wang, et al., "Achromatic Fresnel optics for wideband extreme-ultraviolet and X-ray imaging," Nature 424, pp. 50-53 (2003).
Wang, et al., "Broadband achromatic optical metasurface devices," Nature Communications 8, 187, 9 pages (2017).
Yu & Capasso, "Flat optics with designer metasurfaces," Nature Materials 13, pp. 139-150 (2014).
Arabi, et al., "Proteomic screen reveals Fbw7 as a modulator of the NF-kB pathway," Nature Communications 3, 976, 11 pages (2012).
Decker, et al., "High-Efficiency Dielectric Huygens' Surfaces," Advanced Optical Materials 3(6), pp. 813-820 (2015).
Khorasaninejad, J., et al., "Metalenses at visible wavelengths: Diffraction-limited focusing and subwavelength resolution imaging," Science Magazine, Jun. 3, 2016, vol. 352, No. 6290, pp. 1190-1194.
Yi, et al., "Strong visible magnetic resonance of size-controlled silicon-nanoblock metasurfaces," Applied Physics Express 9(4), (2016).

\* cited by examiner

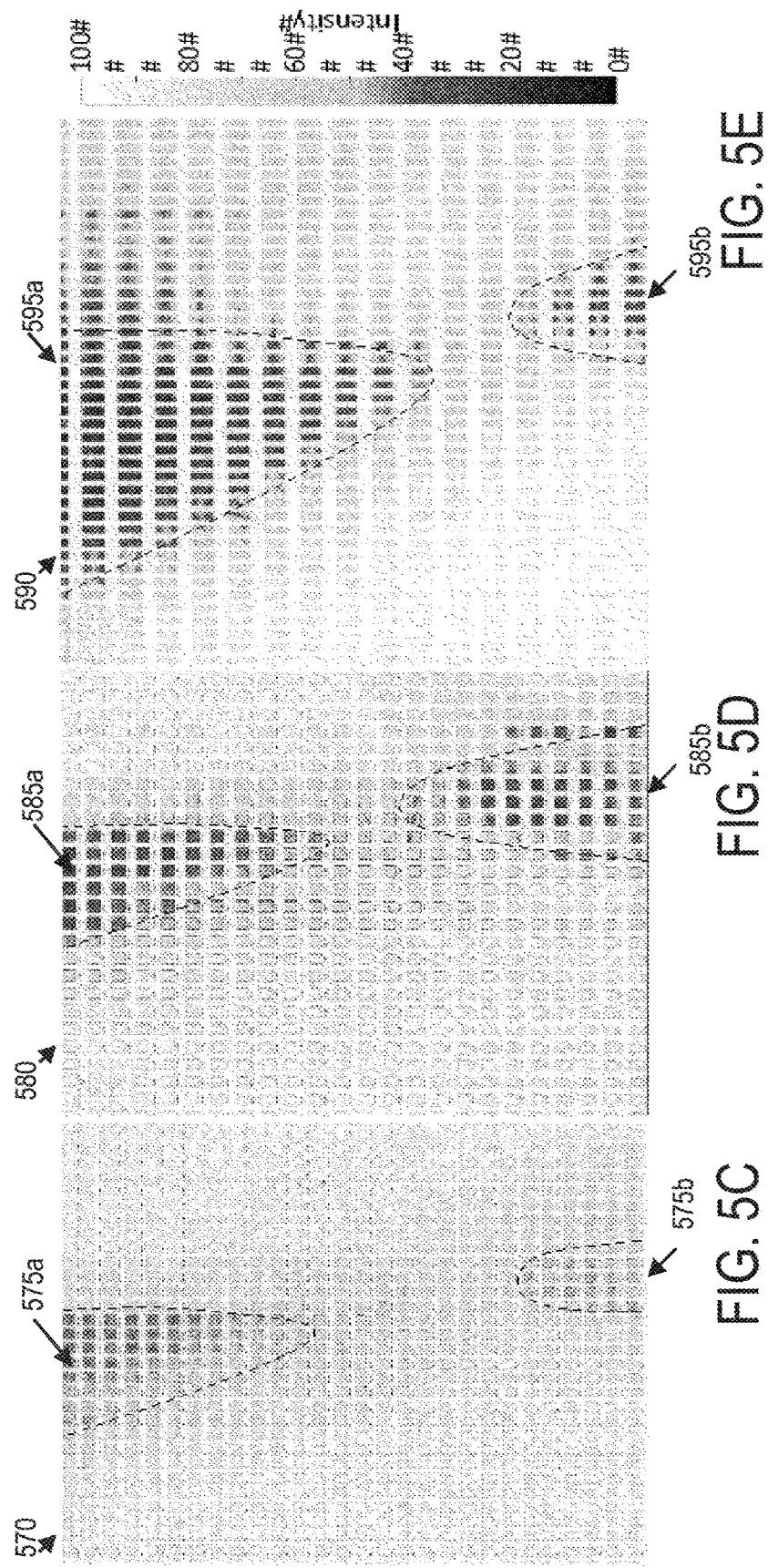

ULTRA-FLAT OPTICAL DEVICE WITH HIGH TRANSMISSION EFFICIENCY

STATEMENT OF GOVERNMENT INTEREST

The United States Government claims certain rights in this invention pursuant to Contract No. DE-AC02-06CH11357 between the U.S. Department of Energy and UChicago Argonne, LLC, as operator of Argonne National Laboratories.

FIELD OF THE INVENTION

The present invention relates generally to the field of optical devices. In particular, the present invention relates to flat optics enabled by dielectric metamaterials.

BACKGROUND

This section is intended to provide a background or context to the invention recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Lenses are an integral part of a large number of optical systems, including microscopes, cameras, telescopes, spectrometers, and so on. Conventionally, lenses designed for the visible wavelengths are made of blocks of glass whose surfaces are polished to be curved in a specific manner, making them incompatible with large-volume semiconductor fabrication processes. For example, cameras and similar devices include such glass lenses. There exists an intrinsic limit to how sleek the glass lenses can be, and major drawbacks associated with glass lenses in small-scale items such as cell phone cameras include the size and bulkiness of such lenses. Lighter and thinner lenses are desirable that would be comparable in efficiency to conventional glass lenses.

The curvature of the glass piece in an optical lens, the curvature defined as the varying thickness across the cross-section of the glass piece in the lens, determines how the light passing through the lens will bend and eventually come to a focal point. In the past decade, as nanofabrication technologies developed, researchers have been exploring ways to bend light by using specifically designed nanostructures arranged on a flat surface.

Conventional nanostructured planar devices are based on metal-dielectric nanostructures. A dielectric material is a substance that is a poor conductor of electricity but an efficient supporter of electrostatic fields. Most dielectric materials are solid. Examples include porcelain (ceramic), mica, glass, plastics, and the oxides of various metals.

Problematically, metals have inherently high dielectric losses for the visible wavelength spectrum. Dielectric loss refers to a dielectric material's inherent dissipation of electromagnetic energy (e.g. heat). It can be parameterized in terms of either the loss angle delta ($\delta$) or the corresponding loss tangent of delta (tan $\delta$). Dielectric loss occurs through conduction, slow polarization currents, and other dissipative phenomena. Because of dielectric loss, metals have poor transmission efficiency across the visible wavelength range.

Conventionally, early-generation nanostructured planar optical devices are based on metal-dielectric nanostructures. However, because metals have inherently high losses for the visible wavelengths, metal-dielectric nanostructures offer poor transmission efficiency across the visible wavelength range. An alternative is an all-dielectric lens. However, although all-dielectric lenses exhibit high efficiency, they are based on tall dielectric pillars with high aspect ratios, and are sensitive to the polarization of incoming light. This makes such all-dielectric flat devices unsuitable for large-scale manufacturing, and certainly not viable for generic (unpolarized) optical applications.

Light is electromagnetic radiation within a certain portion of the electromagnetic spectrum. The wavelength of visible light ranges from roughly 400 nm to roughly 700 nm. Huygens resonators are sub-wavelength dielectric structures for modulating the amplitude and phase of a signal carried by a light beam. Sub-wavelength means that Huygens resonators have dimensions less than the wavelength of the light employed. Huygens resonators form Huygens metasurfaces. Metasurfaces are slabs of sub-wavelength thickness containing sub-wavelength in-plane features (meta-atoms) that are used to realize a desirable functionality by local modification of the interaction between the slab and incident electromagnetic fields. In recent years, such structures have attracted significant attention due to their potential to provide excellent control on properties of transmitted or reflected fields, such as directivity, polarization and orbital angular momentum, with low-profile conformal devices.

Huygens metasurfaces utilize collocated orthogonal electric and magnetic polarizable elements. Problematically, because Huygens resonators are sub-wavelength dielectric particles, conventional Huygens metasurfaces are not generally functional throughout the visible spectrum, including blue, green, and red wavelengths. In the context of the present disclosure, "functional" is defined as capable of bending light (changing the phase of the propagating light) and enabling it to come to a focal point so that an optical device comprising the Huygens metasurface can act as a lens with high transmission efficiency.

Recently, researchers started investigating Huygens surfaces for visible wavelengths. Silicon was their obvious material of choice, but silicon failed to deliver sufficiently low dielectric loss at the points in the spectrum other than near-infrared wavelengths, as shown, for example, in FIG. 1. The dielectric loss of silicon is enough to not allow 100% intensity. Thus, functional Huygens surfaces that include other dielectric materials are desired to bypass this limitation.

SUMMARY

One embodiment of the invention relates to an optical device based on nanostructured transparent dielectric films, or Huygens metasurfaces. The optical device has certain advantages over conventional bulky elements. The Huygens metasurface imparts a phase change to light propagating through or reflecting from the surface. The phase change can be achieved by means of a resonant interaction between light and the Huygens resonators, resulting in a controllable phase change of 0 to $2\pi$ with approximately 100% light transmission (characterized by a below 0.1 dielectric loss tangent) and with the height of the resonators less than the wavelength of light in the visible spectrum. In one embodiment, the metasurface includes titanium dioxide, but many materials or stacks of different materials may be used. The optical device is functional throughout the visible spectrum between 380 and 700 nm. The nanostructured transparent dielectric film includes a plurality of Huygens resonators. The phase and the amplitude of the nanostructured transparent dielectric film are modulated by arranging the plurality of Huygens resonators such that certain properties, including the radius and height of each Huygens resonator, as well as the gap between two adjacent Huygens resonators, are controlled to optimize the performance of the optical device within the visible spectrum.

In one embodiment, the optical device includes a substrate transparent to light in the visible spectrum (400 nm to 700 nm) and a plurality of Huygens resonators on the substrate. Each of the plurality of the Huygens resonators has a gap g between adjacent Huygens resonators of the plurality of the Huygens resonators. Each Huygens resonator is comprised of a dielectric material with a defined height h in the range of 20 nm to 400 nm. Each Huygens resonator has a radius r in the range of 10 nm and 400 nm. The plurality of Huygens resonators forms a Huygens metasurface having a dielectric loss less than 0.1 tangent of delta for light having a wavelength between 400 nm and 700 nm. The overall transmission efficiency of the plurality of Huygens resonators is at least 50%.

In another embodiment, the optical device is coupled with a micro-electro-mechanical systems (MEMS) device such that a resulting arrangement is configured to control the light passing through the optical device and achieve the dielectric loss value less than 0.1 tangent of delta. In some implementations, the optical device is a first optical device coupled to a second optical device. The second optical device includes a second plurality of Huygens resonators forming a second Huygens metasurface. The first optical device and the second optical device are movably arranged relative to one another. The first optical device and the second optical device are configured to control the phase of the light passing through the first optical device and the second optical device such that the first optical device and the second optical device together have a second dielectric loss value less than 0.1 tangent of delta for light having the wavelength between 400 nm and 700 nm.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The disclosure will become more fully understood from the following detailed description, taken in conjunction with the accompanying figures, in which:

FIGS. 5A-E illustrate the performance of a titanium dioxide-based optical device of a certain size, where the optical device includes a titanium dioxide-based Huygens metasurface;

DETAILED DESCRIPTION

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

The present disclosure relates to an optical device based on nanostructured transparent dielectric films, or Huygens metasurfaces, to replace conventional bulky elements of an optical lens. Advantageously, the Huygens metasurfaces of the optical device are functional throughout the visible spectrum. The visible spectrum includes wavelengths of visible light ranging from roughly 400 nm to roughly 700 nm. The device of the present disclosure is designed to operate across the blue (wavelength 380-495 nm; frequency 606-789 THz; photon energy 2.5-3.26 eV), green (wavelength 495-590 nm; frequency 508-606 THz; photon energy 2.1-2.5 eV) and red (wavelength 590-700 nm; frequency 428-508 THz; photon energy 1.77-2.1 eV) spectrum. These spectra may intersect.

The optical device includes an arrangement of nanostructures into a Huygens metasurface comprised of a dielectric material. In one embodiment, an optical device with Huygens metasurfaces is capable of bending light over a range of 400 nm to 550 nm (where the height h2 of a Huygens resonator included in the metasurface is 115 nm) or 480 nm to 620 nm (where the height h3 of a Huygens resonator included in the metasurface is 135 nm) or 532 nm to 700 nm (where the height h4 of a Huygens resonator included in the metasurface is 155 nm). This enables the Huygens metasurface of the optical device to come to a focal point to act as a lens without a significant loss of intensity transmitted through the metasurface.

Figure 1:
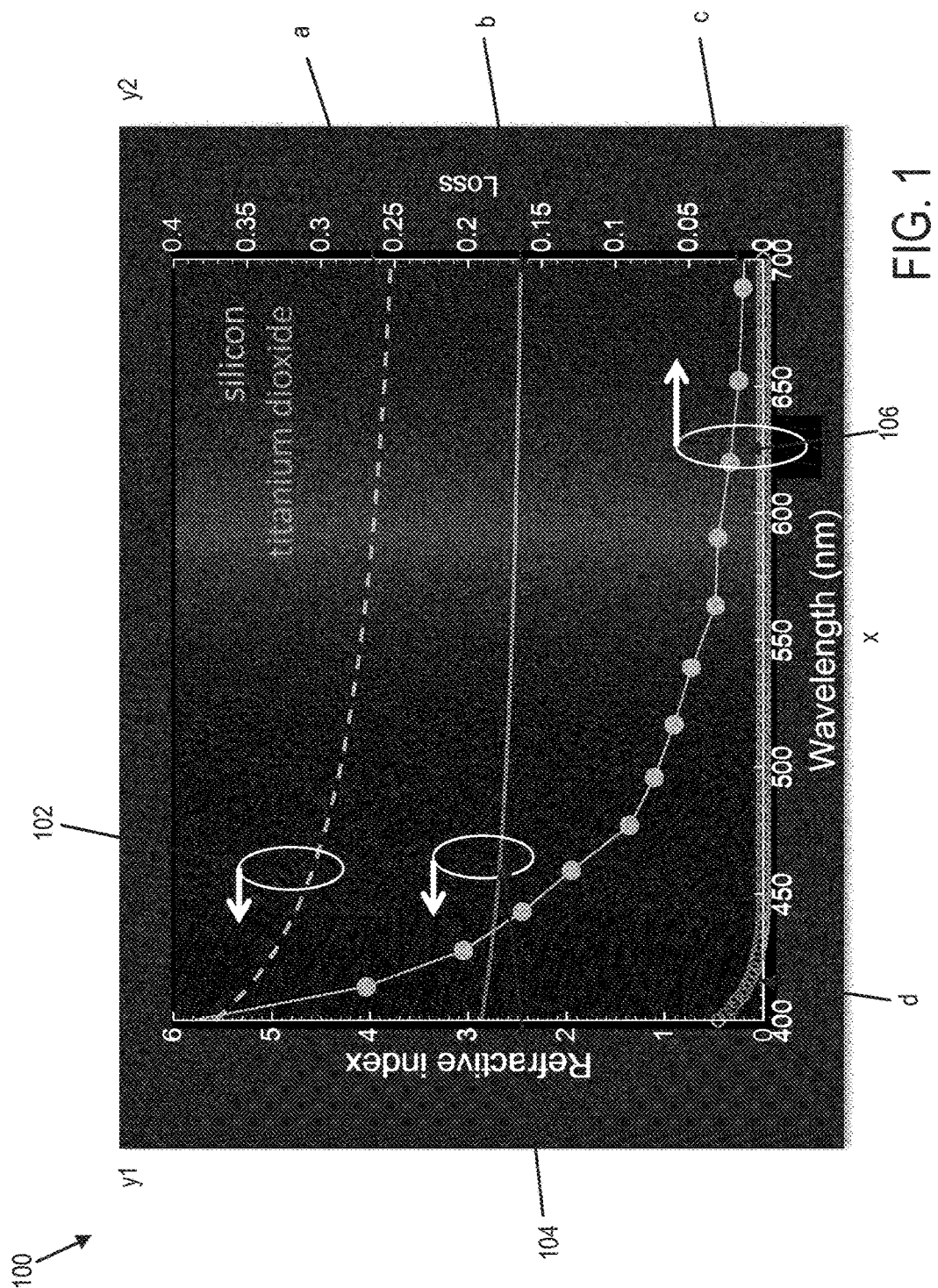
FIG. 1 depicts a refractive index and dielectric loss comparison at visible wavelengths between silicon and titanium dioxide.

Suitable dielectric materials for manufacture of the optical device are low-loss materials, meaning that they are comparatively less prone to the dissipation of electromagnetic energy than higher-loss materials, such as silicon, as shown in FIG. 1. In an embodiment described further herein, titanium dioxide is used as the dielectric material to fabricate the optical device. In another embodiment, gallium phosphide is used instead of or in addition to titanium dioxide. In another embodiment, the nanostructures are comprised of a dielectric material where, as plotted, the electric resonance and the magnetic resonance curves associated with the material have similar shapes and sizes. The electric resonance and the magnetic resonance curves overlap at a given height of the nanostructure for the desired wavelength of operation or the desired range of wavelengths of operation. In another embodiment, any dielectric material with a large refractive index and a low extinction coefficient in the visible wavelength can be used to excite the magnetic and electric dipolar resonances and thus to design a Huygens metasurface.

The Huygens resonators of the present disclosure have low aspect ratios such that the height of any given resonator is at most equal to twice the diameter of that resonator. Advantageously, these low-aspect ratio nanostructures allow for greater off-axis illumination of the structures without a shadowing effect from the adjacent nanostructure. The close proximity of the structures allows for coupling of light between the individual elements of the Huygens metasurface allowing for full $2\pi$ phase change independent of the polarization. This makes the nanostructures of the optical device of the present disclosure suitable for generic (unpolarized) lens applications. In some embodiments, the optical device provides a spatially distributed phase modulation of transmitted and reflected light with up to 100% transmission of incident light. In some embodiments, the optical device provides intensity modulation in addition to the phase modulation.

According to an example embodiment, the low-aspect ratio nanostructures of the optical device are manufactured using a process that is highly compatible with large-throughput semiconductor technologies, such as a complementary metal-oxide-semiconductor (CMOS) fabrication using projection lithography and stamp processes. These processes include those presently explored for the creation of magnetic memory devices such as hard drives. In one embodiment, as part of the manufacturing process, the shape of the Huygens metasurface is transferred into a resist layer on the surface of the film and then, using an appropriate hard mask, such as aluminum oxide or silicon dioxide, the pattern is etched into the titanium dioxide layer, creating the metasurface.

Advantageously, it therefore becomes feasible to develop metadevices using the low aspect ratio nanostructures of the optical device—for example, an ultra-flat high-efficiency lens. These metadevices can replace conventional bulky glass lenses used in optical systems. The compatibility of the optical device fabrication process with current semiconductor technologies makes large-scale manufacturing of such flat metadevices possible. Furthermore, the optical device is suitable for use in microscopes, telescopes, cameras, spectrometers, and other similar devices. Importantly, the optical device of the present disclosure enables miniaturization of such systems. Planarization (arranging on a flat surface) of lenses and other optical elements results in smaller, lighter and even smarter optical systems. Additionally, the low aspect ratio of the nanostructures of the optical device makes it a strong and sustainable candidate for integration with flexible substrates, such as stretchable membranes.

In some embodiments, the optical device of the present disclosure is integrated with MEMS devices. These flat lenses can be integrated onto MEMS devices because they are fabricated using semiconductor fabrication processes. In some embodiments, the flat lenses are integrated onto MEMS devices, integrated circuits (IC) and/or light sources, which streamlines the fabrication of optical systems (e.g., cameras, projectors, etc.) In certain embodiments, the flat lenses are monolithically integrated. Integration with MEMS devices provides additional mechanical degrees of freedom to flat devices, leading to ultra-compact, low power consumption, fast-acting optical systems—for example, a beam scanner with a footprint of one inch. Additionally, using MEMS to move two phase changing flat metasurfaces relative to each other enables novel applications in optical device design and implementation.

FIG. 1 depicts a refractive index and dielectric loss comparison at visible wavelengths between Huygens metasurfaces comprised of silicon and titanium dioxide, respectively. The refractive index n of a material is a dimensionless number that describes how light propagates through that medium. The refractive index n determines the speed of light in a material. It is defined as n=c/v, where c is the speed of light in vacuum and v is the phase velocity of light in the medium. The dielectric loss factor, $\in''$, is a measure of the loss of energy in a dielectric material through conduction, slow polarization currents, and other dissipative phenomena. Generally, a high refractive index, greater than 2.5, is desirable because it allows for greater phase change per propagation distance than a lower refractive index would, resulting in the ability to use thinner materials for designing phase shape elements. A low dielectric loss value, below 0.1 tangent of delta, is desirable to ensure the medium's reliability and transmission efficiency close to 100%.

As shown on the plot 100, the horizontal axis, x, shows the visible wavelength spectrum, $\lambda$, in the range of 400 to 700 nm. The spectrum affects both the refractive index values and the dielectric loss values of silicon and titanium dioxide. The first vertical axis, $y_1$, shows the refractive index n. The second vertical axis, $y_2$, shows the dielectric loss factor. The white circles and arrows (102, 104, and 106) show which of the lines a, b, c, and d are plotted with respect to which axes.

As shown, line a represents the refractive index of silicon and is plotted on the first vertical axis, y1. Line b represents the refractive index of titanium dioxide and is plotted on the first vertical axis, y1. Line c represents the loss of silicon and is plotted with respect to the second vertical axis, y2. Line d represents the loss of titanium dioxide and is plotted with respect to the second vertical axis, y2.

As shown, at the wavelength $\lambda$ of approximately 460 nm, which is on the lower end of the visible spectrum, the refractive index n of titanium dioxide is approximately 2.7 and the refractive index n of silicon is considerably higher, at approximately 4.6. Additionally, the dielectric loss factor value of titanium dioxide is approximately 0.01 and the dielectric loss factor value of silicon is considerably higher, at approximately 0.125.

Figure 2:
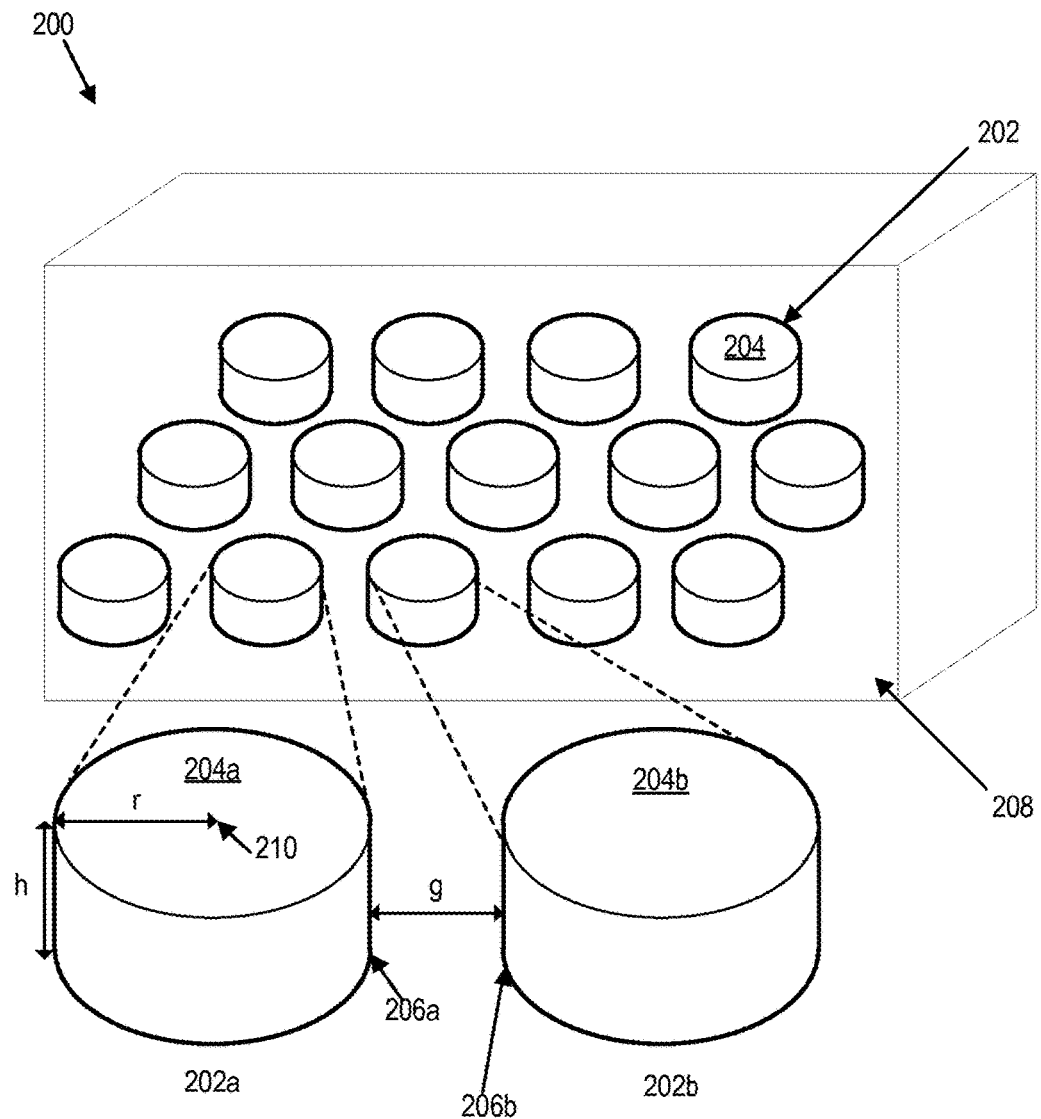
FIG. 2 is a schematic diagram showing one embodiment of a nanostructured transparent dielectric surface (a Huygens metasurface) comprising Huygens resonators.

FIG. 2 is a schematic diagram showing a nanostructured transparent dielectric optical element 200. A change in certain performance parameters of dielectric particles included in the nanostructured transparent dielectric optical element 200 determines the transmission amplitude and phase of the optical element 200, which, in turn, affects its suitability for use in flat optical lenses.

As shown, the optical element 200 includes a Huygens metasurface—that is, the optical element 200 includes a plurality of Huygens resonators 202 (Huygens sources), such as a first Huygens resonator 202a and a second Huygens resonator 202b. Huygens resonators 202 are sub-wavelength dielectric particles for modulating the amplitude and phase of the optical element 200. In some embodiments, the Huygens resonator is positioned on a suitable substrate, such as a transparent substrate like glass, silicon dioxide, quartz, or aluminum oxide. In some embodiments, the Huygens resonator 202 includes a high dielectric material, such as titanium dioxide, gallium phosphide or a combination thereof. In some embodiments, a Huygens resonator 202 consists substantially of a high dielectric material, such as titanium dioxide, gallium phosphide or a combination thereof.

Other suitable materials may be used in certain embodiments. One criterion for selecting the appropriate material is a refractive index of the material that is larger than the refractive index of the suitable substrate (typically >1.5). Another consideration is that the material must support an electric and magnetic resonance, and the magnitude of those resonances must be approximately equal for the desired wavelength of operation for a given thickness of the material.

As shown, the Huygens resonator 202 has a horizontal cross-sectional area 204. In some embodiments, the horizontal cross-sectional area 204 of the Huygens resonator 202 approximates a circle. In some embodiments, the horizontal cross-sectional area 204 of the Huygens resonator 202 approximates an oval. In some embodiments, the horizontal cross-sectional area 204 of the Huygens resonator 202 approximates an ellipse.

Advantageously, the shape of the Huygens resonator 202 allows the Huygens resonator 202 to enable spectral separation of the electric and magnetic Mie resonances by, for example, changing the aspect ratio of the element 200. In some embodiments, the shape of the Huygens resonator 202 is approximated by a right circular cylinder. In some embodiments, the shape of the Huygens resonator 202 is approximated by a right elliptical cylinder. In some embodiments, the Huygens resonator 202 is cylindrical and has substantially straight and parallel sides. In some embodiments, the cylindrical walls of the Huygens resonator 202 do not form 90-degree angles with the top and bottom surfaces, thus making a conic section. In a certain embodiment, the shape of the Huygens resonator 202 is approximated by a tall cone with its top cut off so that the bottom and top surfaces, which define two horizontal cross-sectional areas 204, are parallel, but the side walls are slightly slanted compared with a cylinder.

In some embodiments, the first Huygens resonator 202a and the second Huygens resonator 202b forming the optical element 200 are arranged in a two-dimensional square lattice. In some embodiments, the Huygens resonators are arranged in a hexagonal lattice.

As shown, Huygens resonators 202 (e.g., the first Huygens resonator 202a and the second Huygens resonator 202b) are characterized by the following performance parameters: radius r, height h, and gap g. The combination of radius r, height h, and gap g of the first Huygens resonator 202a determines the parameter space for functional titanium dioxide-based Huygens metasurfaces, as discussed, for example, in reference to FIGS. 5A-C, 6 and 9.

Figure 3:
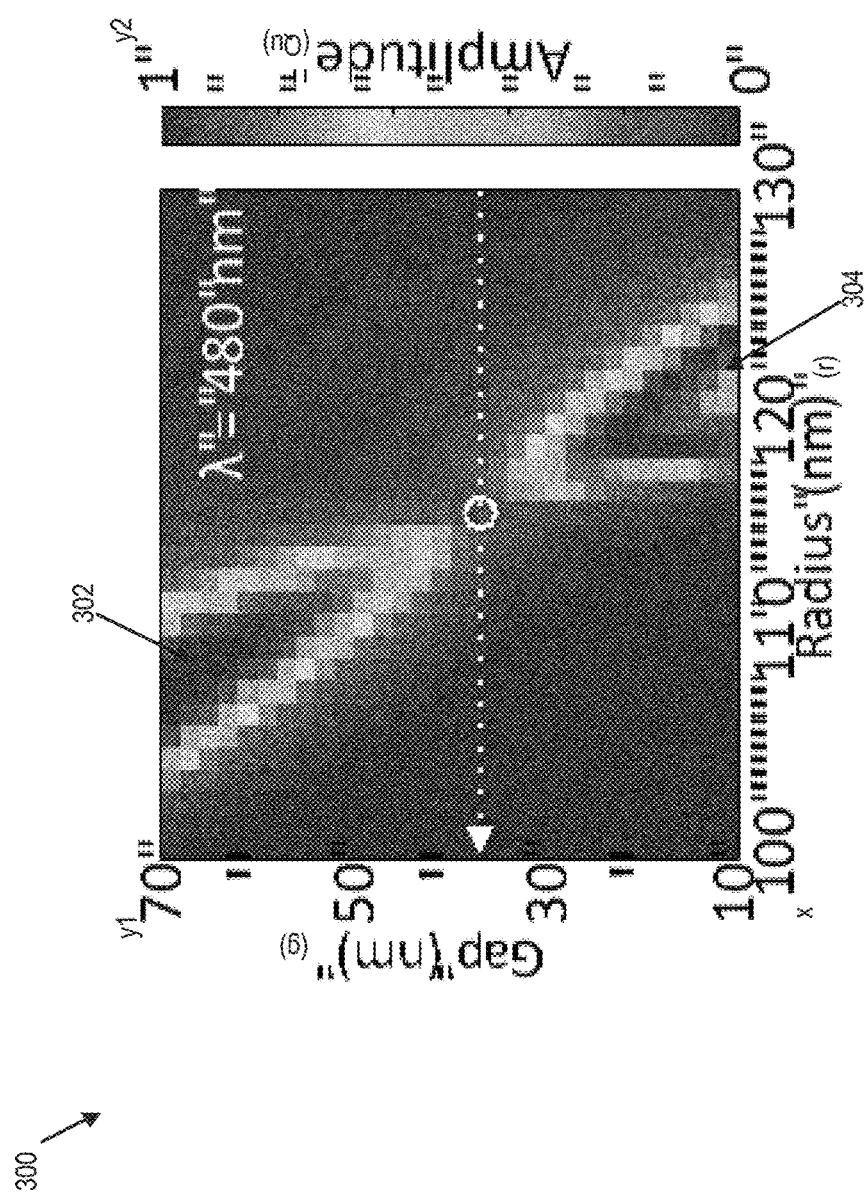
FIG. 3 illustrates a performance characteristic (the amplitude modulation) of the simulation of 480 nm light propagating through a titanium dioxide-based Huygens metasurface where each plotted rectangle is comprised of Huygens resonators of FIG. 2 with different radii and gaps and a constant height, which is less than the wavelength of light.
Figure 4:
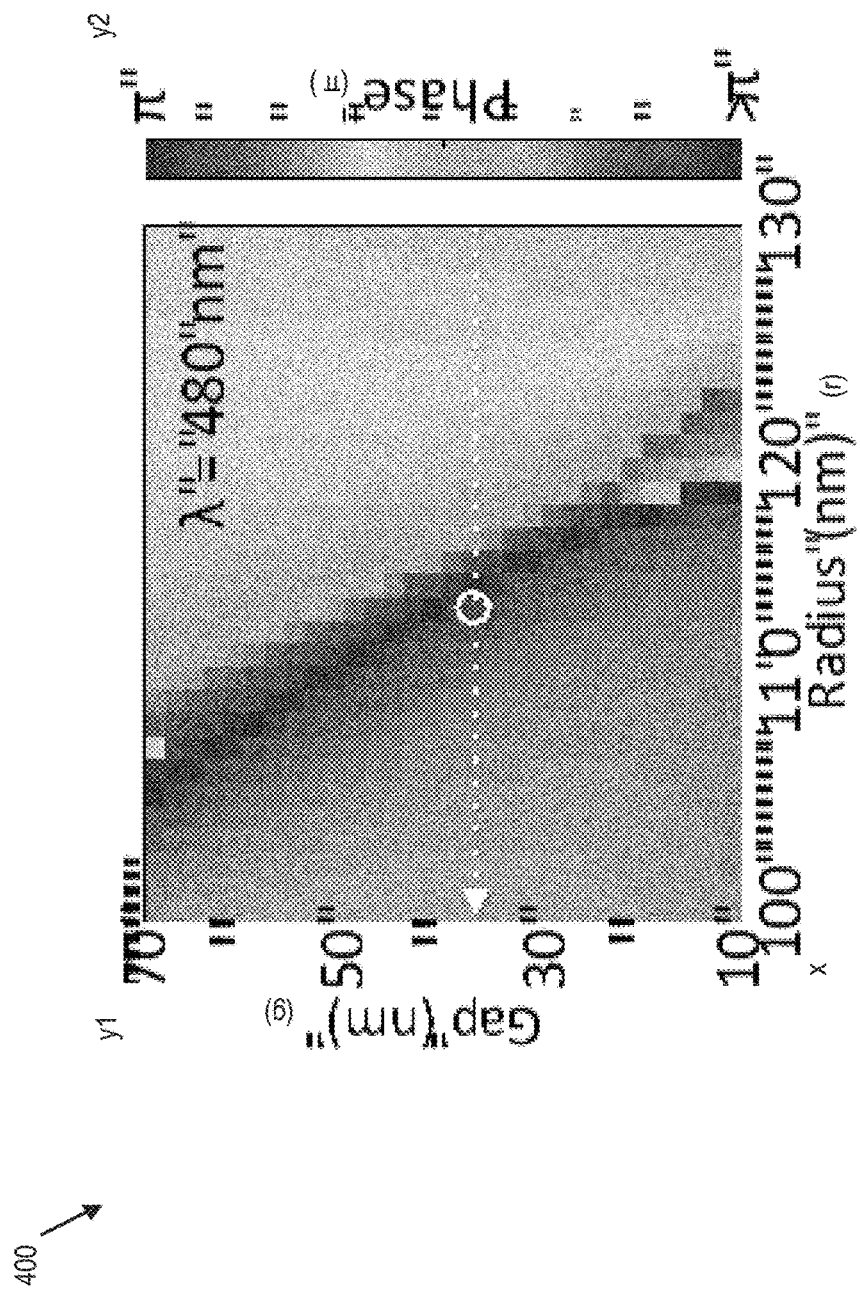
FIG. 4 illustrates a performance characteristic (the phase modulation) of the simulation of 480 nm light propagating through a titanium dioxide-based Huygens metasurface where each plotted rectangle is comprised of Huygens resonators of FIG. 2 with different radii and gaps and a constant height, which is less than the wavelength of light.

The radius r of the first Huygens resonator 202a is the distance between the center point 210 of the first horizontal cross-sectional areas 204a and the line defining the circumference of the substantially circular first horizontal cross-sectional area 204a. As shown in FIG. 9, in some embodiments, the radius r is in the range of 90 and 180 nm. As shown in FIGS. 3 and 4, in certain embodiments, the radius r is in the range of 100 and 130 nm. Overall, Huygens resonators, according to various embodiments, have a radius that ranges from 10 nm to 400 nm.

The gap g between the first Huygens resonator 202a and the second Huygens resonator 202b is the distance between their adjacent sides 206a and 206b. In embodiments where the first Huygens resonator 202a and the second Huygens resonator 202b are substantially cylindrical, the gap g is defined as the smallest distance between: (i) a first line of the plurality of vertical lines connecting the line defining the circumference of the first horizontal cross-sectional area 204a and the base 208 at a 90-degree angle for the first Huygens resonator 202a and (ii) a second line of the plurality of vertical lines connecting the circumference of the second horizontal cross-sectional area 204b and the base 208 at a 90-degree angle for the second Huygens resonator 202b, where the first Huygens resonator 202a and the second Huygens resonator 202b are adjacent to each other. In some embodiments (not shown), the gap g is defined as the distance between the center points 210 of the horizontal cross-sectional areas 204a and 204b of two adjacent Huygens resonators 202, each cross-section taken at an approximately equal distance from the base 208. As shown in FIGS. 3 and 4, in some functional embodiments, the gap g is in the range of 10 and 70 nm. In some embodiments, the gap ranges from 10 nm to 400 nm.

The height h of the first Huygens resonator 202a is approximated by the length of the shortest vertical line in a plurality of vertical lines connecting the circumference of the first horizontal cross-sectional area 204a and the base 208 at a 90-degree angle. In some embodiments, the height h is 135 nm. However, as illustrated in FIG. 5B, the height h may vary between 20 nm and 400 nm.

FIG. 3 illustrates a performance characteristic (the amplitude modulation) of the simulation of 480 nm light propagating through a titanium dioxide-based optical device 200 of FIG. 2. Depicted is a Huygens metasurface where each plotted rectangle is a Huygens resonator 202 of FIG. 2. The Huygens resonators 202 have different radii r and gaps g and a constant height h, the height h being less than the wavelength of light. Generally, modulation is the process of varying one or more properties of a periodic waveform—in this case, the waveform is a beam of light transmitted in the visible spectrum at the fixed wavelength $\lambda''$ of 480 nm, and the modulated property is its amplitude. The amplitude, measured on the scale of 0 to 1, measures the intensity of light and is an instrumental property to control in modulating the frequency of a signal in optical transmissions.

As shown on the plot 300, the second vertical axis, $y_2$, shows the amplitude as a function of the radius r, shown on the abscissa, and the gap g, shown on the ordinate (the first vertical axis $y_1$). As shown, the radius r, defined in reference to FIG. 2, is in the range of 100-130 nm, and the gap g, also defined in reference to in FIG. 2, is in the range of 10-70 nm. As shown, the regions 302 and 304 define the intersections of the values of gap g and radius r where the amplitude is low and therefore transmission quality is poor (less than 30%). The regions 302 and 304 also begin to show the separation of the electric and magnetic resonances in the material.

The circle in the center of the figure demonstrates the Huygens point, defined as the maximum transmission through the metasurface for a given height, for various radii r and gaps g. As shown, in the embodiment of FIG. 3, the dotted line represents a subset of the metasurface parameters that provide for maximum transmission and $2\pi$ phase change for a given height metasurface. As shown, designing a phase change element, such as a lens, using the parameters of the metasurface with the specific gap g of 35-40 nm and over a range of radii r (75 nm to 155 nm) produces a phase change element able to achieve $2\pi$ phase change at high transmission efficiency.

FIG. 4 illustrates a performance characteristic (the phase modulation) of the simulation of 480 nm light propagating through a titanium dioxide-based Huygens metasurface where each plotted rectangle is comprised of Huygens resonators of FIG. 2 with different radii r and gaps g and a constant height h of less than the wavelength of light. The phase (range: $-\pi \leq \pi'' \leq \pi$) is an instrumental property to encode the transmitted information in optical communication systems. The dotted line and circle match the parameters in FIG. 3 showing the phase change of a full $2\pi$.

As shown, the modulated waveform is a beam of light transmitted in the visible spectrum at the fixed wavelength $\lambda''$ of 480 nm, and the modulated property is its phase. On the plot 400, the scale bar on the right hand side of the image, $y_2$, shows the phase as a function of the values of the plot. A phase of $-\pi$ is blue, a phase of $+\pi$ is red and a phase of zero is yellow/green. The radius r, as defined in reference to FIG. 2, is in the range of 100-130 nm, and the gap g, as defined in reference to FIG. 2, is in the range of 10-70 nm. As shown, the phase state space is determined by a combination of values for the gap g, radius r, for a fixed height, h. In conjunction with FIG. 3, a set of radii r and a single gap g can be chosen to produce a phase change element capable of achieving $2\pi$ phase change with maximum transmission amplitude.

FIGS. 5A-E illustrate the performance of a titanium dioxide-based optical device of a certain size, where the optical devise includes a titanium dioxide-based Huygens metasurface comprised of the Huygens resonators of FIG. 2.

Figure 5A:
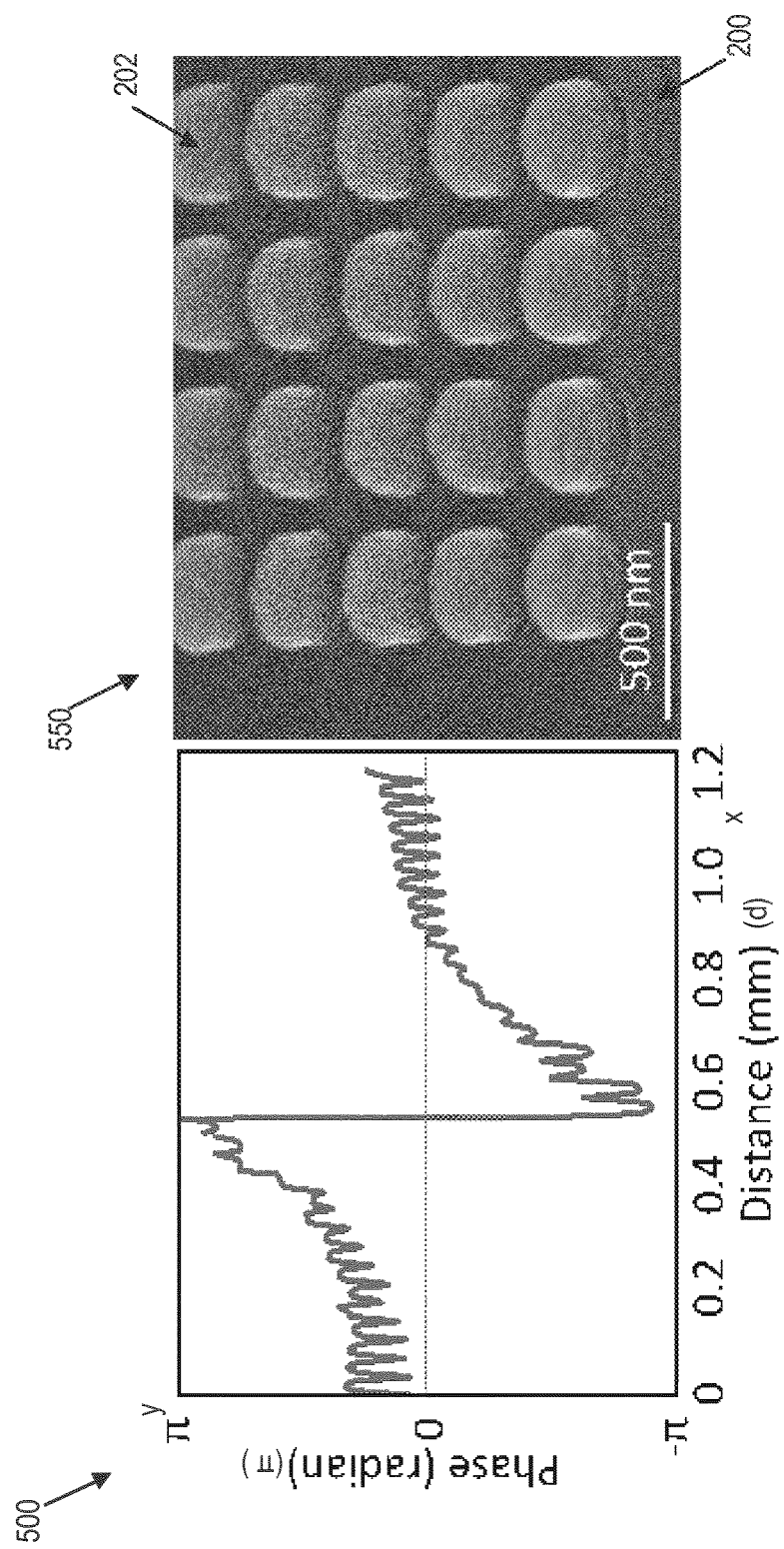
Figure 5B:
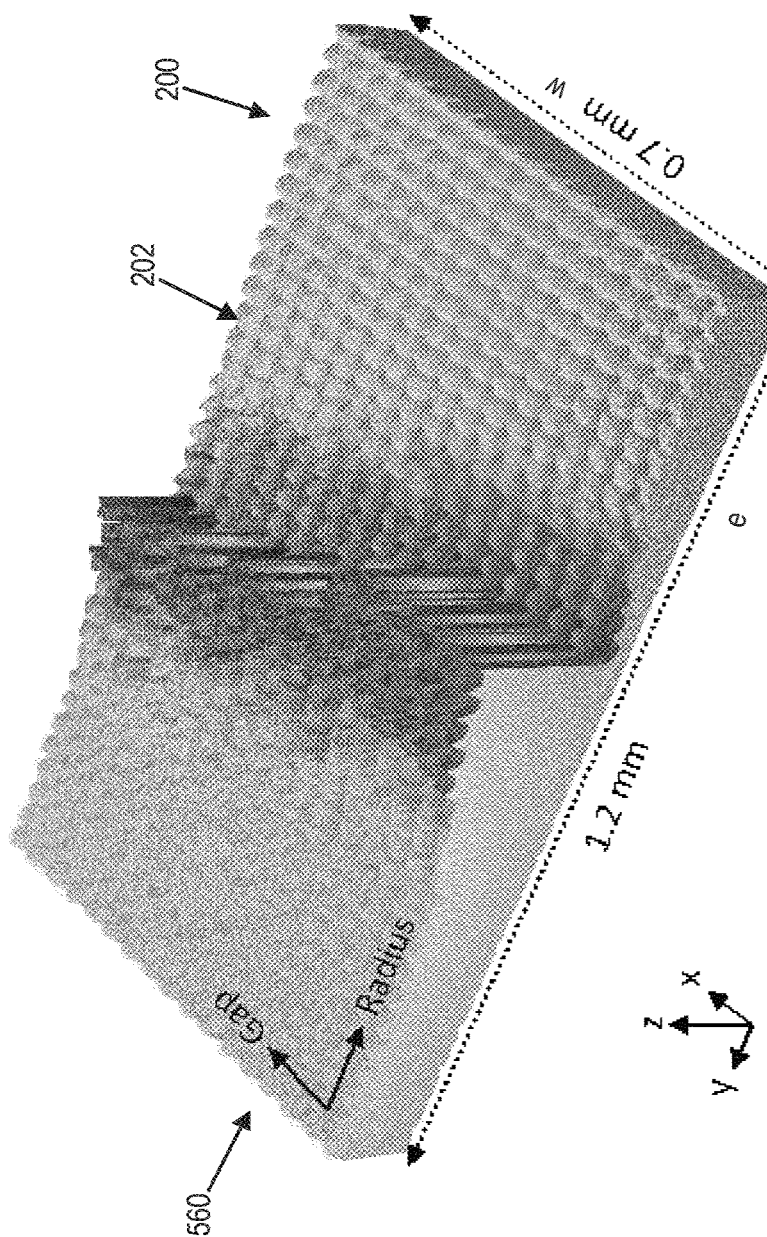

FIG. 5A shows the measured phase change of an array of Huygens metasurfaces with a constant height h and gap g with varying radii r, illustrating, in an example embodiment, the ability to control the phase by a full $2\pi$ and a scanning electron micrograph of typical Huygens metasurfaces used in the measurement. The line plot 500 shows the phase change for a fixed gap g and different radii r. As shown, the phase shift of $2\pi$ occurs at the distance d of approximately 0.5 mm. Here, the distance d, measured from the edge of the realization of an array of Huygens metasurfaces where the radius, r, is changed along the distance, d. This is a realization of simulated results, consistent with FIG. 4, showing a phase change of $2\pi$ over a range of radii. The oscillatory nature of the plot is a result of a finite spacing between individual Huygens metasurfaces. The overall trend shows that the measured data in FIG. 5A qualitatively matches the data in FIG. 4. In another embodiment (not shown), the radii r varied from 140 nm to 172 nm, the gap remained constant at 50 nm, and the thickness of the film was 155 nm. At 550, a magnified view of the Huygens resonator 202 of FIG. 2 is shown.

FIG. 5B is a three-dimensional visualization of the phase change associated with an array of Huygens metasurfaces with various gaps g and radii r. Depicted is a 3D rendering of the measured phase change of an array of Huygens metasurfaces with a constant height h and varying radii r and gap g as indicated by the arrows on the left side. At 560, a scaled optical element 200 of FIG. 2 is depicted. The length l of the optical surface of the optical element 200 is 1.2 mm and the width w of the optical surface is 0.7 mm. As shown, the scaled optical element 560 includes a plurality of Huygens resonators 202 (shown in FIG. 2). The tiling effect (set of squares with gaps between Huygens resonators 202) results from spacing between individual Huygens metasurfaces with different radii r and gaps g. In another embodiment (not shown), the radius r varied from 43 nm to 60 nm.

FIG. 5C-5E show the intensity (amplitude) of a light beam transmitted at a certain wavelength frequency in a titanium dioxide-based optical device that includes the Huygens resonators 202 of FIG. 2. As shown, the transmitted intensity of light through a titanium dioxide Huygens metasurface is measured with constant height h and varying radius r and gap g. A similar behavior to the simulations in FIG. 3 is established for light with wavelengths 475 nm±25 nm (FIG. 5C), 532 nm±10 nm (FIG. 5D) and 650 nm±10 nm (FIG. 5E). The dotted lines show the areas of low transmission (regions 575a, 575b, 585a, 585b, 595a and 595b), as observed in FIG. 3.

FIG. 5C-5E demonstrate large-intensity transmission (greater than 50%) through the Huygens point for metasurfaces designed with different heights for different wavelengths similar to FIG. 3.

As shown in FIG. 5C, the wavelength is fixed to 480 nm, corresponding to the blue in the visible spectrum. Regions 575a and 575b show diminished intensity and therefore diminished transmission quality. The Huygens resonators range in diameter from 89 nm to 121 nm and in gap g from 20 nm to 76 nm.

As shown in FIG. 5D, the wavelength is fixed to 530 nm corresponding to green in the visible spectrum. Regions 585a and 585b show diminished intensity and therefore diminished transmission quality. The Huygens resonators range in diameter from 108 nm to 133 nm and in gap g from 20 nm to 66 nm.

As shown in FIG. 5E, the wavelength is fixed to 633 nm, corresponding to the red in the visible spectrum. Regions 595a and 595b show diminished intensity and therefore diminished transmission quality. The Huygens resonators range in diameter from 130 nm to 172 nm and in gap g from 40 nm to 70 nm.

Figure 6:
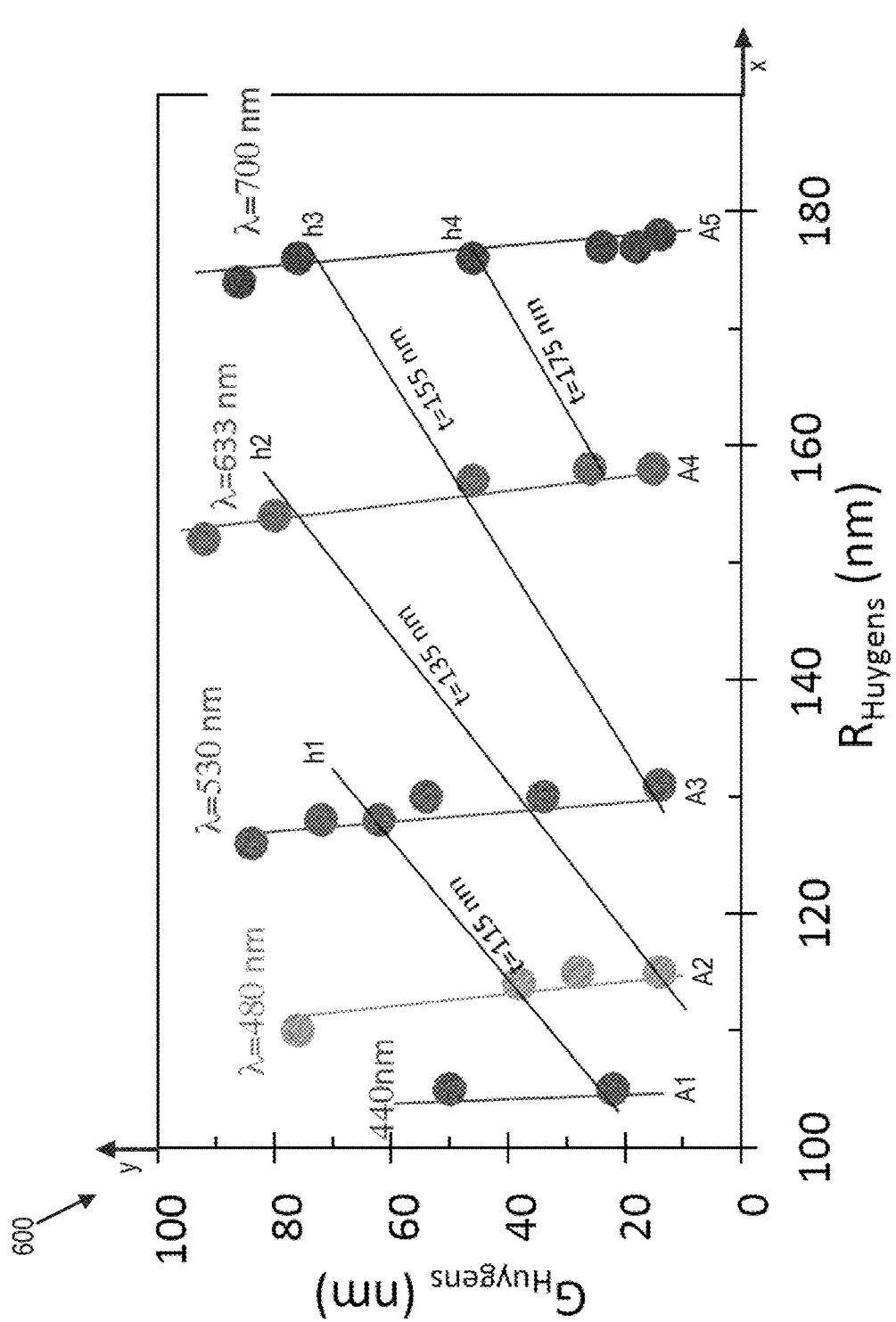
FIG. 6 relates to identifying the parameter space for a titanium dioxide-based Huygens metasurface. The plot shows the range in parameters of the Huygens metasurface where a full $2\pi$ phase change can occur with near 100% transmission efficiency for Huygens metasurfaces with different heights.

FIG. 6 relates to identifying the parameter space for a titanium dioxide-based Huygens metasurface. As shown on the plot 600, the parameter space is defined, on the x-axis, by the radius r of the Huygens resonator 202 of FIG. 2, and, on the y-axis, by the gap g between the first Huygens resonator 202a and the second Huygens resonator 202b of FIG. 2. The plot 600 demonstrates the range in parameters of the Huygens metasurface where a full $2\pi$ phase change can occur with near 100% transmission efficiency. As shown, the Huygens metasurfaces h1, h2, h3, h4 and h5 have different heights (h1=95 nm, h2=115 nm, h3=135 nm, and h4=155 nm, and h5=175 nm.) Also shown are various wavelengths of light (A1=400 nm, A2=480 nm, A3=532 nm, A4=632 nm and A5=700 nm). The Huygens metasurfaces h1, h2, h3, h4 were exposed to the wavelengths A1, A2, A3, and A4. In an illustrative example of practical realization of parameters that yield functional Huygens metasurfaces, the gap g is at least 10 nm and the radius r is at least 10 nm. The claims herein are not limited by the examples illustrated in FIG. 6. Thus, in some embodiments, the gap g is as large at 400 nm, and the radius r is as large as 400 nm.

Figure 7:
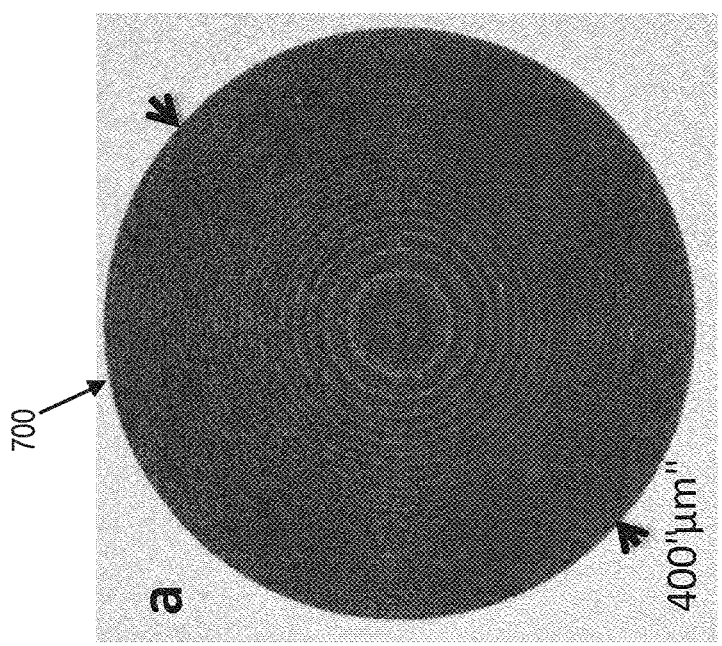
FIG. 7 shows a plan view of one embodiment of a flat optical lens comprising a titanium dioxide-based Huygens metasurface with a diameter of 400 µm.

FIG. 7 depicts a plan view of a flat optical lens comprising titanium dioxide-based Huygens metasurface. As shown, the optical lens 700 is an ultra-flat lens designed and fabricated to use titanium dioxide Huygens resonators, such as one or more Huygens resonator 202 of FIG. 2. In some embodiments, the optical lens 700 is an optical device 200 of FIG. 2 and includes a nanostructured transparent dielectric surface (a Huygens metasurface). In an example embodiment, the diameter of the optical lens 700 is 400 µm. In some embodiments, the optical lens 700 is a dielectric film with unchanged thickness throughout. In some embodiments, the optical lens 700 is a blue lens. In some embodiments, the optical lens 700 is a green lens. In some embodiments, the optical lens 700 is a red lens.

Figure 8A:
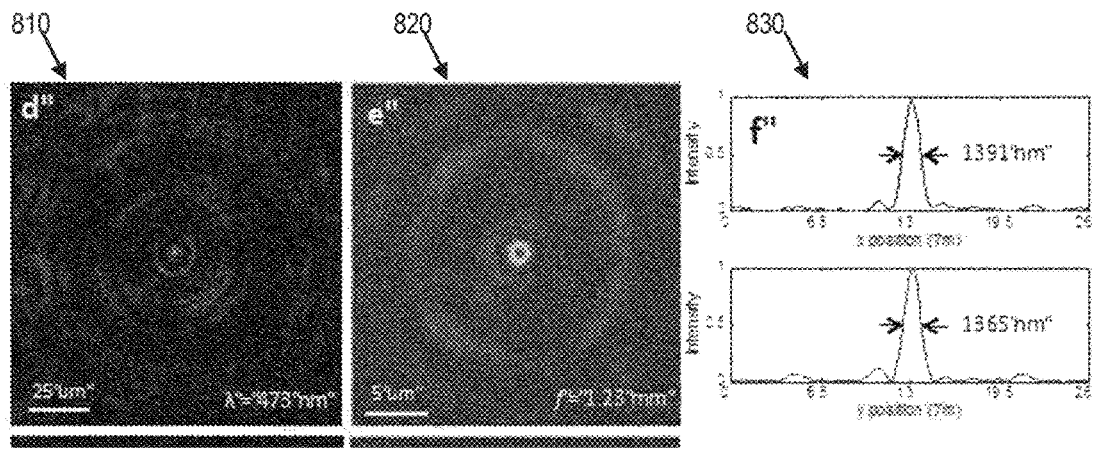
FIGS. 8A-C illustrate the performance of the flat optical lens of FIG. 7 within the blue (FIG. 8A), green (FIG. 8B), and red (FIG. 8C) light ranges of the visible spectrum, showing the pictures of the focal spots using a microscope in the left images, the digitized pictures in the center images and the ordinate and abscissa line-out plots of the spot sizes (from the corresponding center image) in the right images.
Figure 8B:
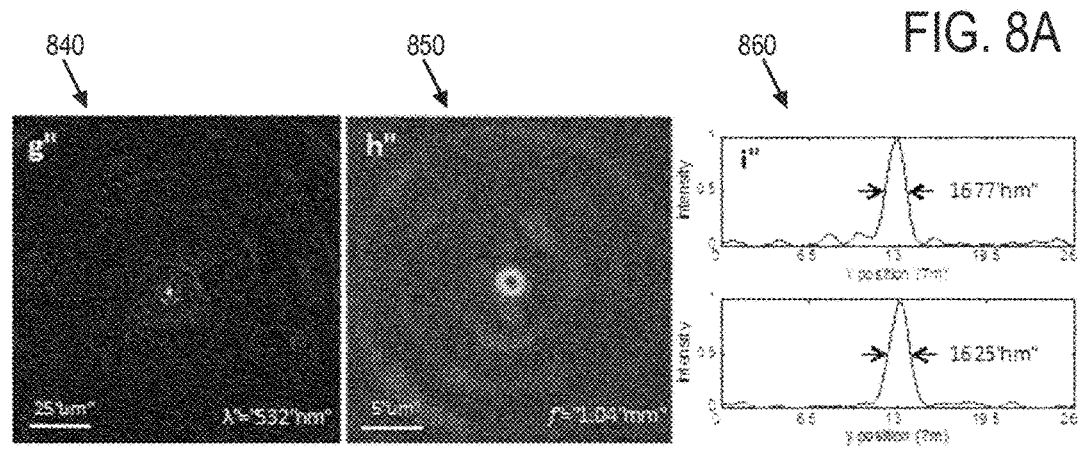
Figure 8C:
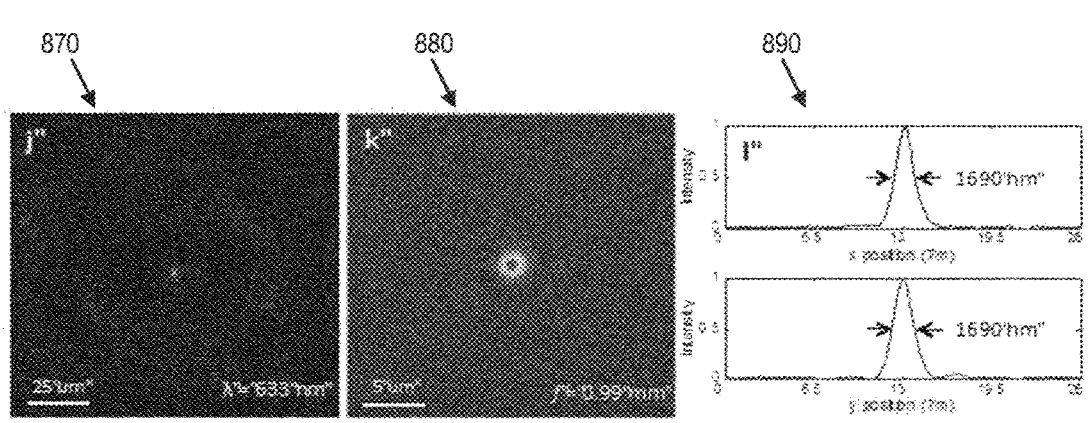

FIGS. 8A-C illustrate the performance of the flat optical lens of FIG. 7 within the blue, red, and green light ranges of the visible spectrum, showing the pictures of the focal spots using a microscope in the left images, the digitized pictures in the center images and the ordinate and abscissa line-out plots of the spot sizes (from the corresponding center image) in the right images. Diffraction limited focal spots were characterized. Lens efficiencies were measured as 23%, 45% and 65% for blue, green and red wavelengths λ. The efficiencies of the lenses are defined as the ratio of the intensity of light within 5 µm of the focal spot to the intensity incident on the full lens (400 µm area). As a result, designs for some embodiments of the optical lens 700 of FIG. 7 were developed.

Referring to FIG. 8A, plots 810, 820, and 830 show the optical lens 700 if FIG. 7 tested at the wavelength λ" of 473 nm, which is within the blue range, and with the focal length f" at 1.23 mm. Referring to FIG. 8B, plots 840, 850, and 860 show the optical lens 700 if FIG. 7 tested at the wavelength λ" of 532 nm, which is within the green range, and with the focal length f" at 1.04 mm. Referring to FIG. 8C, plots 870, 880, and 890 show the optical lens 700 if FIG. 7 tested at the wavelength λ" of 633 nm, which is within the red range, and with the focal length f" at 0.99 mm.

The left images (810, 840, and 870 of FIGS. 8A, 8B, and 8C respectively) show the pictures of the focal spots using a microscope focused to the focal spot of the lens with a scale bar of 25 µm as shown in the images. The center images (820, 850, and 880 of FIGS. 8A, 8B, and 8C respectively) show the digitized intensity of the corresponding microscope images (810, 840, and 870 of FIGS. 8A, 8B, and 8C respectively) as plotted using a data plotting software package. The scale bar shown in these images corresponds to 5 µm. The right images (830, 860, and 890 of FIGS. 8A, 8B, and 8C respectively) show the ordinate and abscissa line-out plots of the spot sizes in the respective center images. The line-out plots show the intensity of the image as a function of its position in both the abscissa and ordinate. The arrows show the full width at half maximum values of the peaks from the center image. The values achieved are near the diffraction limited focal spot sizes for the designs of the corresponding lenses.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

References herein to the positions of elements (i.e. "top," "bottom," "above," "below," "on," etc.) are merely used to describe the orientation of various elements in the figures. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

What is claimed:

1. An optical device comprising:
    a substrate transparent to light in visible wavelength spectrum of 400 nm to 700 nm; and
    a plurality of Huygens resonators on the substrate, each of the plurality of the Huygens resonators having a gap "g" between adjacent Huygens resonators of the plurality of the Huygens resonators, each Huygens resonator comprised of a dielectric material with a defined height "h" in the range of 10 nm to 400 nm, and each Huygens resonator having a radius "r" in the range of 10 nm and 400 nm,
    wherein the plurality of Huygens resonators form a Huygens metasurface having a dielectric loss value less than 0.1 tangent of delta for light having a wavelength between 400 nm and 700 nm.

2. The optical device of claim 1, wherein each of the plurality of Huygens resonators is substantially a right circular cylinder or substantially a right elliptical cylinder.

3. The optical device of claim 1, wherein the plurality of Huygens resonators comprises a first resonator and a second resonator positioned such that the gap "g" between the first resonator and the second resonator is in the range of 10 nm to 400 nm.

4. The optical device of claim 1, wherein a refractive index of the plurality of Huygens resonators is in the range of 1.5 to 20.

5. The optical device of claim 1, wherein overall transmission efficiency is greater than 0%.

6. The optical device of claim 1, wherein each of the plurality of the Huygens resonators comprises titanium dioxide.

7. The optical device of claim 1, wherein each of the plurality of the Huygens resonators comprises gallium phosphide.

8. The optical device of claim 1 coupled with a MEMS device such that a resulting arrangement is configured to control light passing through the optical device and achieve the dielectric loss value less than 0.1 tangent of delta.

9. The optical device of claim 1, wherein the optical device is a first optical device coupled to a second optical device, the second optical device comprising a second plurality of Huygens resonators forming a second Huygens metasurface; and wherein the first optical device and the second optical device are movably arranged relative to one another and configured to control phase of the light passing through the first optical device and the second optical device such that the first optical device and the second optical device together have a second dielectric loss value less than 0.1 tangent of delta for light having the wavelength between 400 nm and 700 nm.

10. A resonator that is a Huygens source for a dielectric optical device functional at wavelengths between 400 nm and 700 nm, wherein the resonator is substantially cylindrical and comprises a low-loss material.

11. The resonator of claim 10, wherein the low dielectric loss material is titanium dioxide.

12. The resonator of claim 10, wherein the low dielectric loss material is gallium phosphide.

13. The resonator of claim 10, the resonator having a radius in the range of 10 nm and 400 nm.

14. The resonator of claim 13, the resonator having a height not greater than four times the radius.

* * * * *